(12) United States Patent
Maimon

(10) Patent No.: US 8,003,434 B2
(45) Date of Patent: Aug. 23, 2011

(54) REDUCED DARK CURRENT PHOTODETECTOR

(76) Inventor: Shimon Maimon, Rochester, NY (US)

( * ) Notice: Subject to any disclaimer, the term of this patent is extended or adjusted under 35 U.S.C. 154(b) by 0 days.

(21) Appl. No.: 12/656,739

(22) Filed: Feb. 16, 2010

(65) Prior Publication Data

US 2010/0159631 A1   Jun. 24, 2010

Related U.S. Application Data

(62) Division of application No. 11/276,962, filed on Mar. 19, 2006, now Pat. No. 7,687,871.

(51) Int. Cl.
*H01L 31/00* (2006.01)
(52) U.S. Cl. ... 438/98; 257/189; 257/441; 257/E31.019; 438/74; 438/84
(58) Field of Classification Search .................. 257/189, 257/441, E31.019, E31.021; 438/74, 84, 438/93, 98
See application file for complete search history.

(56) References Cited

U.S. PATENT DOCUMENTS

| | | | | |
|---|---|---|---|---|
| 4,652,335 | A * | 3/1987 | Decoster et al. | 438/93 |
| 4,679,063 | A | 7/1987 | White | |
| 4,682,196 | A | 7/1987 | Sakai et al. | |
| 4,731,640 | A | 3/1988 | Bluzer | |
| 6,380,604 | B1 | 4/2002 | Shima | |
| 7,531,440 | B2 * | 5/2009 | Ukai | 438/603 |
| 7,795,640 | B2 * | 9/2010 | Klipstein | 257/188 |
| 2002/0070389 | A1 | 6/2002 | Song | |
| 2006/0108528 | A1 | 5/2006 | Qiu | |
| 2006/0267007 | A1 | 11/2006 | Salzman et al. | |

FOREIGN PATENT DOCUMENTS

| | | | |
|---|---|---|---|
| WO | WO 2005/004243 A1 * | 1/2005 | |
| WO | WO-2005004243 A1 | 1/2005 | |
| WO | WO-2007/107971 A3 | 9/2007 | |

OTHER PUBLICATIONS

Landau et al. Quantam Mechanics, Butterworth-Heinemann; 3 edition (Jan. 1, 1981), ISBN-13: 978-0750635394.
Chen et al. Semicond. Sci. Technol. 5 (1990) S100-S102.
Maimon and Wicks, Abstract Book of 11th International Conference on Narrow Gap Semiconductors, Jun. 2003, Buffalo, N.Y.

* cited by examiner

*Primary Examiner* — Allan R Wilson
(74) *Attorney, Agent, or Firm* — Hulsey, P.C.; William N. Hulsey, III; Loren T. Smith

(57) ABSTRACT

A photo-detector comprising: a photo absorbing layer comprising an n-doped semiconductor exhibiting a valence band energy level; a barrier layer, a first side of the barrier layer adjacent a first side of the photo absorbing layer, the barrier layer exhibiting a valence band energy level substantially equal to the valence band energy level of the doped semiconductor of the photo absorbing layer; and a contact area comprising a doped semiconductor, the contact area being adjacent a second side of the barrier layer opposing the first side, the barrier layer exhibiting a thickness and a conductance band gap sufficient to prevent tunneling of majority carriers from the photo absorbing layer to the contact area and block the flow of thermalized majority carriers from the photo absorbing layer to the contact area. Alternatively, a p-doped semiconductor is utilized, and conductance band energy levels of the barrier and photo absorbing layers are equalized.

31 Claims, 3 Drawing Sheets

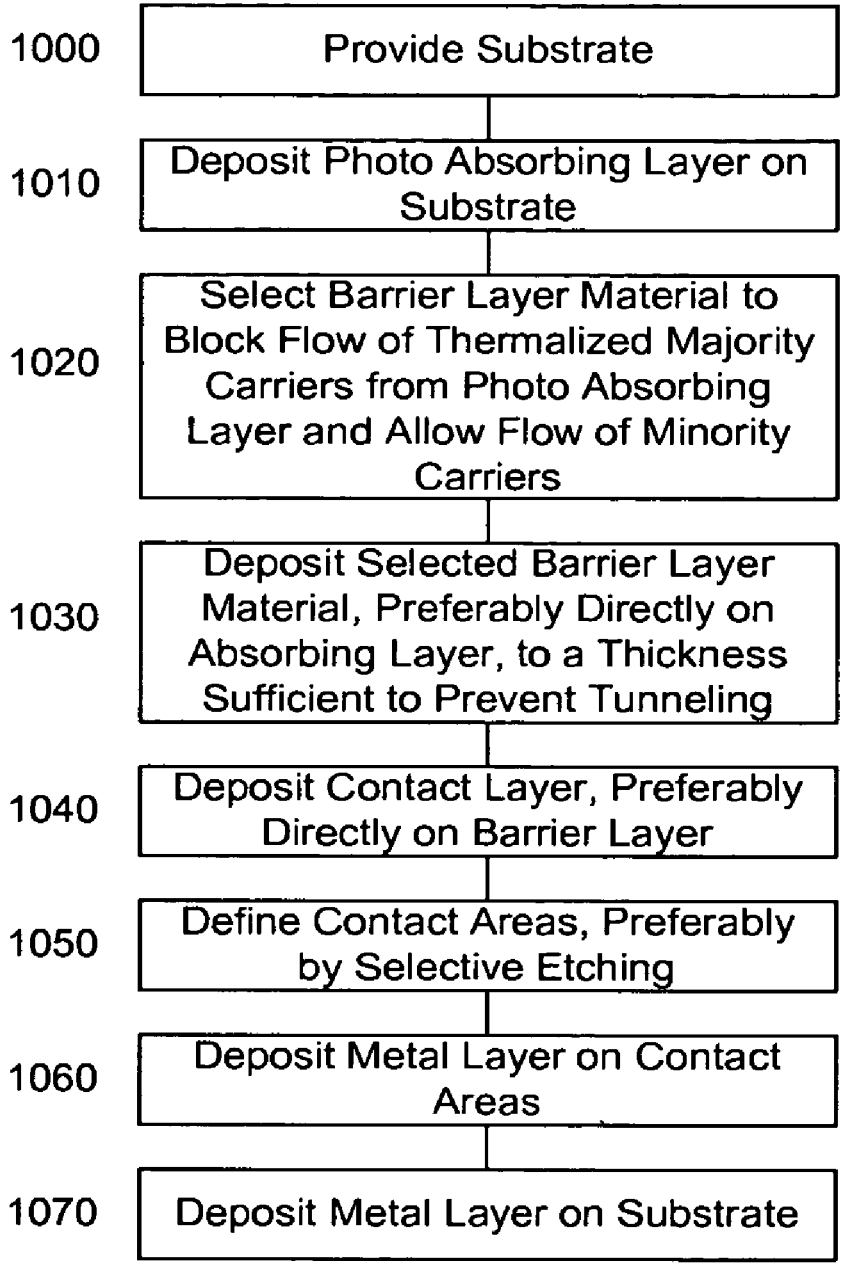

REDUCED DARK CURRENT PHOTODETECTOR

CROSS-REFERENCE TO RELATED APPLICATION

This application is a divisional of and claims priority from U.S. patent application Ser. No. 11/276,962, filed Mar. 19, 2006 now U.S. Pat. No. 7,687,871 the entire contents of which is incorporated herein by reference.

BACKGROUND OF THE INVENTION

The invention relates generally to the field of semiconductor based photo-detectors and in particular to a photo-detector exhibiting a barrier region between an active semiconductor region and a contact semiconductor region.

Photo-detectors are used in a wide variety of applications including imaging. A specific type of photo-detector sensitive to the infra-red wavelengths of light is also known as an infra-red detector. Infra-red covers a broad range of wavelengths, and many materials are only sensitive to a certain range of wavelengths. As a result, the infra-red band is further divided into sub-bands such as near infra-red defined conventionally as 0.75-1.4 µm; short wavelength infra-red defined conventionally as 1.3-3 µm; mid wavelength infra-red defined conventionally as 3-8 µm; and far infra-red defined conventionally as 15-1,000 µm. Infra-red in the range of 5 µm to 8 µm is not well transmitted in the atmosphere and thus for many infra-red detection applications mid-wavelength infra-red is referred to as 3-5 µm.

Infra-red detectors are used in a wide variety of applications, and in particular in the military field where they are used as thermal detectors in night vision equipment, air borne systems, naval systems and missile systems. Highly accurate thermal detectors have been produced using InSb and HgCdTe p-n junction diodes, however these thermal detectors require cooling to cryogenic temperatures of around 77 K which is costly. The cryogenic temperatures primarily are used to reduce the dark current generated in the p-n junction diode by among other effects Shockley Reed Hall (SRH) generation.

There are three main contributions to the dark current, denoted as $I_{dark}$, of photodiodes based on narrow band gap semiconductors. The fluctuations of the dark current components are a major factor in the noise that limits the device performance. These components are:

a) a generation current associated with the Shockley-Reed-Hall (SRH) process in the depletion region, $I_{srh}$;

b) a diffusion current associated with auger or radiative processes in the extrinsic area, $I_{diff}$; and c) a surface current associated with the surface states in the junction, $I_{surf}$. The surface current depends primarily on the passivation process done for the device.

Thus, $I_{dark}$ can be expressed as:

$$I_{dark} = I_{srh} + I_{diff} + I_{surf} \quad \text{Equation 1}$$

The SRH generation process is very efficient in the depletion region of photodiodes where the mid-gap traps are highly activated. It is the main source of the dark current in photodiodes operable for mid-wavelength infrared at temperatures below 200K. The current associated with this source is:

$$J_{SRH} \approx q \frac{n_i}{\tau_{SRH}} W_{dep} \quad \text{Equation 2}$$

where $n_i$ is the intrinsic concentration of the semiconductor, $W_{dep}$ is the depletion width (typically in the range of 1 µm), and $\tau_{srh}$ is the SRH lifetime of minority carriers in the extrinsic area. The SRH lifetime of minority carriers in the extrinsic area depends on the quality of the material, i.e. the trap concentration, and is typically in the range of ~1 µsec in low doped material (~$10^{16}$ cm$^{-3}$). The dependence of SRH current on $n_i$ produces an activation energy of $E_g/2$ ($n_i \sim \exp(-E_g/2kT)$), because the source of this generation process is through mid-gap traps. A secondary source of dark current in photodiodes is thermal generation in the neutral regions and diffusion to the other side of the junction. This thermal generation current depends on the auger or radiative process in this area, and is expressed as:

$$J_{diff} \approx q p_n \times \frac{1}{\tau_{diff}} \times L = q \frac{n_i^2}{N_d} \times \frac{1}{\tau_{diff}} \times L \quad \text{Equation 3}$$

where $\tau_{diff}$ is the lifetime, and in an n-type material exhibiting a doping concentration, denoted $N_d$, of ~1-2·$10^{16}$ cm$^{-3}$ is in the range of ~0.5 µsec, depending only slightly on temperature. L is the width of the neutral region of the device or the diffusion length of minority carriers (the smaller of the two) and $p_n$ is the hole concentration in the active n type semiconductor in equilibrium and it equal to $n_i^2/N_d$. The activation energy of the diffusion current is $E_g$, ($n_i^2 \sim \exp(-E_g/kT)$) as the process involves band to band excitation.

Additionally, p-n junction diodes, and particularly those produced for thermal imaging require a passivation layer in the metallurgic junction between the p and n layers. Unfortunately this is often difficult to achieve and significantly adds to the cost of production.

There is thus a long felt need for a photo-detector having reduced dark noise. Preferably the photo-detector would be sensitive to the mid wavelength infra-red band and not require expensive passivation in production. Further preferably the photo-detector would be operable at significantly higher temperatures than 77K.

SUMMARY OF THE INVENTION

Accordingly, it is a principal object of the present invention to overcome the disadvantages of prior art photo-detectors, and in particular mid wavelength infra-red detectors. This is provided in the present invention by a photo-detector sensitive to a target waveband comprising a photo absorbing layer, preferably exhibiting a thickness on the order of the optical absorption length. In an exemplary embodiment the photo absorbing layer is deposited to a thickness of between one and two times the optical absorption length. A contact layer is further provided, and a barrier layer is interposed between the photo absorbing layer and the contact layer. The barrier layer exhibits a thickness sufficient to prevent tunneling of majority carriers from the photo absorbing layer to the contact layer, and a band gap barrier sufficient to block the flow of thermalized majority carriers from the photo absorbing layer to the contact layer. The barrier layer does not significantly block minority carriers.

An infra-red detector in accordance with the principle of the invention can be produced using either an n-doped photo absorbing layer or a p-doped photo absorbing layer, in which the barrier layer is designed to have no offset for minority carriers and a band gap barrier for majority carriers. Current in the detector is thus almost exclusively by minority carriers. In particular, for an n-doped photo absorbing layer the junction between the barrier layer and the absorbing layer is such that there is substantially zero valence band offset, i.e. the band gap difference appears almost exclusively in the conduction band offset. For a p-doped photo absorbing layer the junction between the barrier layer and the absorbing layer is such that there is substantially zero conduction band offset, i.e. the band gap difference appears almost exclusively in the valence band offset.

Advantageously the photo-detector of the subject invention does not exhibit a depletion layer, and thus the dark current is significantly reduced. Furthermore, in an exemplary embodiment passivation is not required as the barrier layer further functions to achieve passivation.

The invention provides for a photo-detector comprising: a photo absorbing layer comprising an n-doped semiconductor exhibiting a valence band energy level and a conducting band energy level; a barrier layer, a first side of the barrier layer adjacent a first side of the photo absorbing layer, the barrier layer exhibiting a valence band energy level substantially equal to the valence band energy level of the photo absorbing layer and a conduction band energy level exhibiting a significant band gap in relation to the conduction band of the photo absorbing layer; and a contact area comprising a doped semiconductor, the contact area being adjacent a second side of the barrier layer opposing the first side, the barrier layer exhibiting a thickness, the thickness and the band gap being sufficient to prevent tunneling of majority carriers from the photo absorbing layer to the contact area and block the flow of thermalized majority carriers from the photo absorbing layer to the contact area.

In one embodiment the barrier layer comprises an undoped semiconductor. In another embodiment the contact area is n-doped. In a further embodiment, the contact area exhibits a valence band energy level substantially equal to the valence band energy level of the n-doped semiconductor of the photo absorbing layer.

In one embodiment the contact area is p-doped. In one further embodiment the contact area exhibits a valence band energy level greater than the valence band energy level of the n-doped semiconductor of the photo absorbing layer. In another further embodiment the barrier layer comprises an undoped semiconductor.

In one embodiment the photo absorbing layer is operable to generate minority carriers in the presence of light energy exhibiting a wavelength of 3-5 microns. In another embodiment the photo-detector further comprises a substrate exhibiting a first side adjacent a second side of the photo absorbing layer, the second side of the photo absorbing layer opposing the first side of the photo absorbing layer, the substrate exhibiting a second side in contact with a metal layer. Preferably, the photo-detector further comprises an additional metal layer in contact with the contact area.

In one embodiment the barrier layer comprises one of AlSb, AlAsSb, GaAlAsSb, AlPSb, AlGaPSb and HgZnTe. In a further embodiment the photo absorbing layer is constituted of one of n-doped InAs, n-doped InAsSb, n-doped InGaAs, n-doped Type II super lattice InAs/InGaSb and n-doped HgCdTe. In a yet further embodiment the contact area is constituted of one of InAs, InGaAs, InAsSb, Type II super lattice InAs/InGaSb, HgCdTe and GaSb. In a yet further embodiment the contact area and the photo absorbing layer exhibit substantially identical compositions.

In one embodiment the photo absorbing layer and the contact area are constituted of n-doped HgCdTe and the barrier layer is constituted of HgZnTe, and in another embodiment the photo absorbing layer and the contact layer are constituted of n-doped type II super lattice InAs/InGaSb and the barrier layer is constituted of AlGaAsSb. In another embodiment the photo absorbing layer is constituted of n-doped InAsSb, the barrier layer is constituted of AlGaAsSb and the contact layer is constituted of p-doped GaSb. In one embodiment the photo absorbing layer exhibits a thickness on the order of the optical absorption length.

The invention independently provides for a photo-detector comprising: a photo absorbing layer comprising a p-doped semiconductor exhibiting a conduction band energy level and a valence band energy level; a barrier layer, a first side of the barrier layer adjacent a first side of the photo absorbing layer, the barrier layer exhibiting a conduction band energy level substantially equal to the conduction band energy level of the photo absorbing layer and a valence band energy level exhibiting a significant band gap in relation to the valence band of the photo absorbing layer; and a contact area comprising a doped semiconductor, the contact area adjacent a second side of the barrier layer opposing the first side, the barrier layer exhibiting a thickness, the thickness and the band gap being sufficient to prevent tunneling of majority carriers from the photo absorbing layer to the contact area and to block the flow of thermalized majority carriers from the photo absorbing layer to the contact area.

In one embodiment the barrier layer comprises an undoped semiconductor. In another embodiment the contact area is p-doped. In one further embodiment the contact area exhibits a conduction band energy level substantially equal to the conduction band energy level of the p-doped semiconductor of the photo absorbing layer.

In one embodiment the contact area is n-doped. In one further embodiment the contact area exhibits a conduction band energy level less than the conduction band energy level of the p-doped semiconductor of the photo absorbing layer. In another further embodiment the barrier layer comprises an undoped semiconductor.

In one embodiment the photo absorbing layer is operable to generate minority carriers in the presence of light energy exhibiting a wavelength of 3-5 microns. In another embodiment the photo-detector further comprises a substrate exhibiting a first side adjacent a second side of the photo absorbing layer, the second side of the photo absorbing layer opposing the first side of the photo absorbing layer, the substrate exhibiting a second side in contact with a metal layer. In a further embodiment the photo-detector further comprises a metal layer in contact with the contact area.

In one embodiment the barrier layer comprises one of AlSb, AlAsSb, GaAlAsSb, AlPSb, AlGaPSb, InAlAs, InAlAsSb, and HgZnTe. In one further embodiment the photo absorbing layer is constituted of one of p-doped InAs, p-doped InAsSb, p-doped InGaAs, p-doped Type II super lattice InAs/InGaSb and p-doped HgCdTe. In one yet further embodiment the contact area is constituted of one of InAs, InGaAs, InAsSb, Type II super lattice InAs/InGaSb, HgCdTe and GaSb. In one yet further embodiment the contact area and the photo absorbing layer exhibit substantially identical compositions.

The invention independently provides for a method of producing a photo-detector, the method comprising: providing a substrate; depositing on the substrate a photo absorbing layer comprising a doped semiconductor exhibiting an energy level associated with non-conducting majority carriers; depositing on the deposited photo absorbing layer a barrier layer exhibiting a thickness, an energy level associated with minority carriers of the photo absorbing layer substantially equal to the energy level of the photo absorbing layer and a band gap associated with majority carriers of the photo absorbing layer; and depositing on the deposited barrier layer a contact layer comprising a doped semiconductor, the thickness and the band gap of the barrier layer being sufficient to prevent tunneling of majority carriers from the photo absorbing layer to the contact layer and to block the flow of thermalized majority carriers from the photo absorbing layer to the contact layer.

In one embodiment the method further comprises selectively etching the deposited contact layer to define a plurality of contact areas. In another embodiment at least one of depositing the photo absorbing layer, depositing the barrier layer and depositing the contact layer is done via one of molecular beam epitaxy, metal organic chemical vapor deposition, metal organic phase epitaxy and liquid phase epitaxy.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 4 illustrates a high level flow chart of the process of manufacture of the multi pixel photo-detector of FIGS. 1B-1C.

DETAILED DESCRIPTION OF THE PREFERRED EMBODIMENTS

Figure 1A:
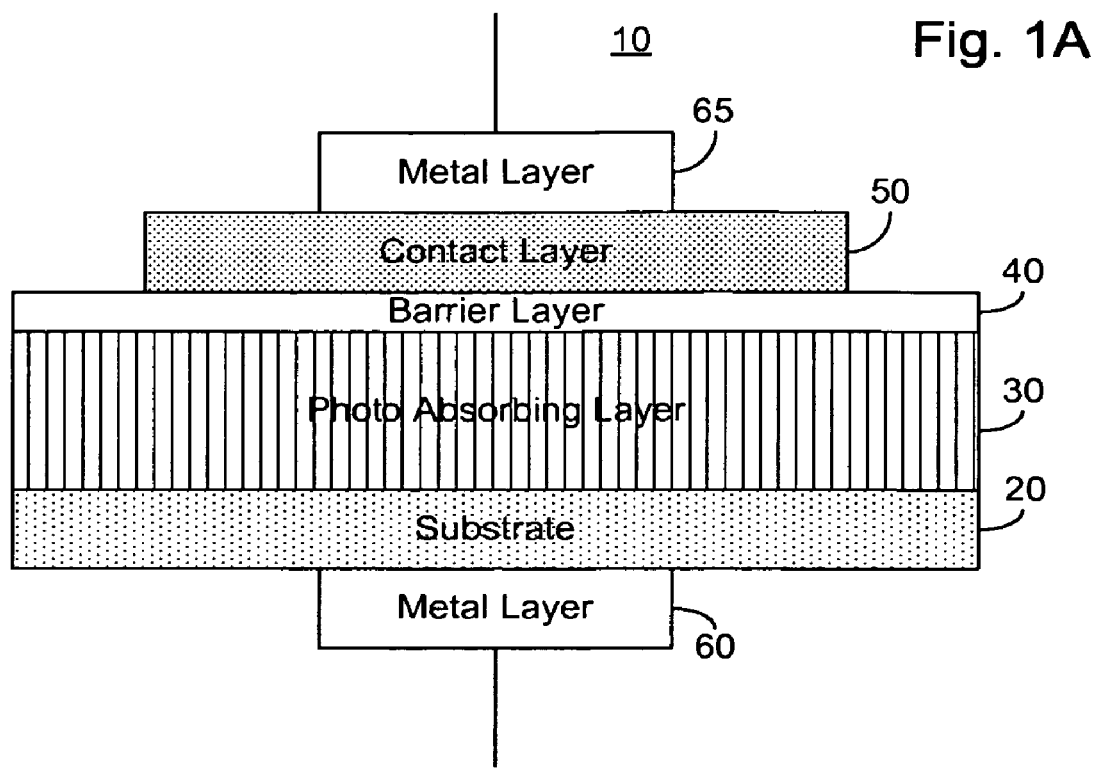
FIG. 1A illustrates a high level schematic view of the layers of a single photo-detector according to an embodiment of the principle of the invention.

The present embodiments enable a photo-detector sensitive to a target waveband comprising a photo absorbing layer, preferably exhibiting a thickness on the order of an optical absorption length of the target waveband. In an exemplary embodiment the photo absorbing layer is deposited to a thickness of between one and two times the optical absorption length. A contact layer is further provided, and a barrier layer is interposed between the photo absorbing layer and the contact layer. The barrier layer exhibits a thickness sufficient to prevent tunneling of majority carriers from the photo absorbing layer to the contact layer, and a band gap barrier sufficient to block the flow of thermalized majority carriers from the photo absorbing layer to the contact layer. The barrier layer does not significantly block minority carriers.

An infra-red detector in accordance with the principle of the invention can be produced using either an n-doped photo absorbing layer or a p-doped photo absorbing layer, in which the barrier layer is designed to have substantially no offset for minority carriers and a band gap barrier for majority carriers. Current in the detector is thus almost exclusively by minority carriers. In particular, for an n-doped photo absorbing layer the junction between the barrier layer and the absorbing layer is such that there is substantially zero valence band offset, i.e. the band gap difference appears almost exclusively in the conduction band offset. For a p-doped photo absorbing layer the junction between the barrier layer and the absorbing layer is such that there is substantially zero conduction band offset, i.e. the band gap difference appears almost exclusively in the valence band offset.

Advantageously the photo-detector of the subject invention does not exhibit a depletion layer, and thus the dark current is significantly reduced. Furthermore, in an exemplary embodiment passivation is not required as the barrier layer further functions to achieve passivation.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1A illustrates a high level schematic view of the layers of a photo-detector 10 according to an embodiment of the principle of the invention comprising a substrate 20, a photo absorbing layer 30, a barrier layer 40, a contact layer 50, a metal layer 60 and a metal layer 65. Substrate 20 is provided as a base for deposition and has deposited on one face metal layer 60 for connection to electronic circuitry. In an exemplary embodiment metal layer 60 is constituted of gold. Photo absorbing layer 30 is deposited on the second face of substrate 20 opposing the first face. Photo absorbing layer 30 comprises a doped semiconductor responsive to photons of the object wavelength, and preferably is deposited to a thickness on the order of an optical absorption length. In one embodiment photo absorbing layer 30 is deposited to a thickness of between one and two times the optical absorption length. In an exemplary embodiment photo absorbing layer 30 comprises one of n-doped InAs; n-doped InAsSb; n-doped InGaAs; n-doped type II super lattice of the type InAs/InGaSb; and n-doped HgCdTe. In an alternative embodiment absorbing layer 30 comprises one of p-doped InAs; p-doped InAsSb; p-doped InGaAs; p-doped type II super lattice of the type InAs/InGaSb; and p-doped HgCdTe.

Barrier layer 40 is deposited directly on photo absorbing layer 30 without requiring passivation. Barrier layer 40 is deposited to a thickness sufficient to substantially prevent tunneling of majority carriers from photo absorbing layer 30 to contact layer 50, and in an exemplary embodiment is deposited to a thickness of 50-100 nm. Barrier layer 40 comprises a material selected to exhibit a high band gap barrier for majority carriers from photo absorbing layer 30 and substantially no band gap barrier for minority carriers. Barrier layer 40 is thus sufficient to block both the flow of thermalized majority carriers and the tunneling of majority carriers from photo absorbing layer 30 to contact layer 50. Thus, for an n-type photo absorbing layer 30, the band gap difference appears in the conduction band, whereas substantially no band gap offset appears in the valence band. In one embodiment barrier layer 40 comprises one of AlSb, AlAsSb, GaAlAsSb, AlPSb, AlGaPSb and HgZnTe. In an exemplary embodiment photo absorbing layer 30 comprises n-doped InAs and barrier layer 40 is comprised of $AlAs_xSb_{1-x}$, with x~0.15, and thus there is ~0 valence band offset.

Contact layer 50 is deposited on barrier layer 40. Contact layer 50 functions to absorb the minority carriers diffused from the absorbing layer 30 and is essentially a contact layer. In an exemplary embodiment contact layer 50 is deposited to a thickness of 20-50 nm and is constituted of one of InAs; InAsSb; InGaAs; type II super lattice of the type InAs/InGaSb; HgCdTe and GaSb. Contact layer 50 may be n-doped or p-doped without exceeding the scope of the invention. Advantageously, contact layer 50 may be constituted of the same material as photo absorbing layer 30. Contact layer 50 is etched, preferably by photolithography, to define the detector area. Advantageously etching of barrier layer 40 or absorbing layer 30 is not required. Metal layer 65 is deposited on contact layer 50, and in an exemplary embodiment is constituted of gold. Metal layers 60, 65 enable the connection of an appropriate bias, and a connection to detect a flow of current from photo absorbing layer 30 to contact layer 50.

Figure 1B:
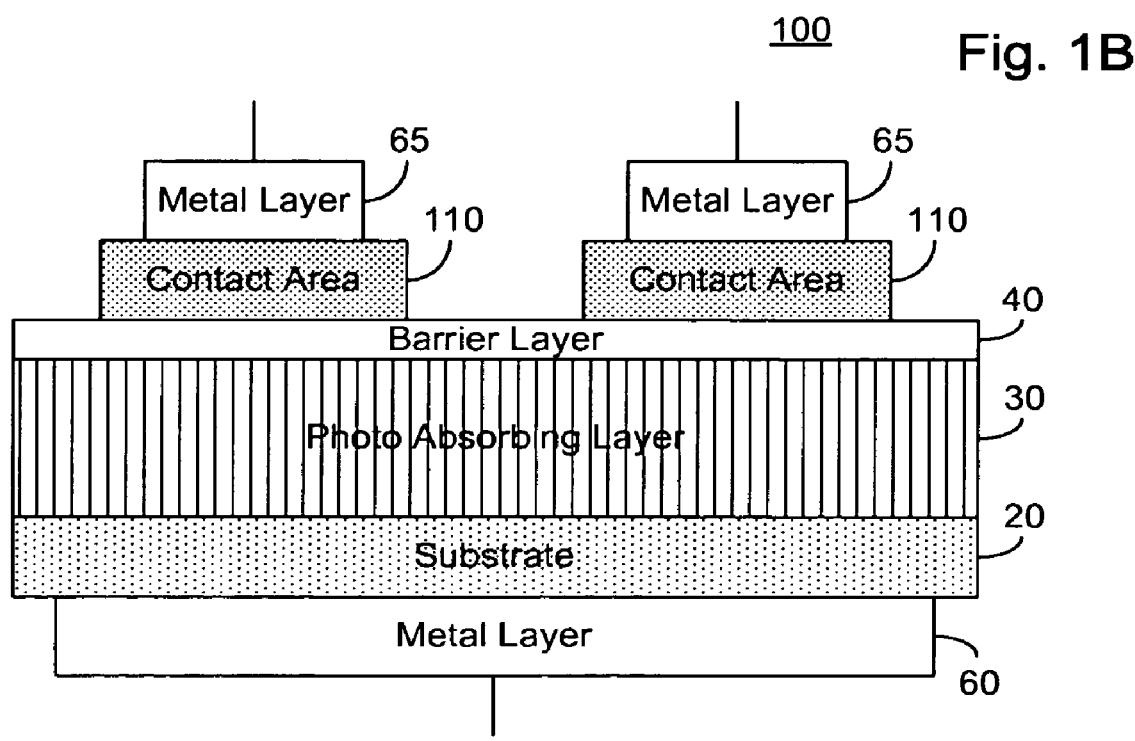
FIG. 1B illustrates a side view of a multi-pixel photo-detector according to an embodiment of the principle of the invention.

FIG. 1B illustrates a side view of a multi-pixel photo-detector 100 according to an embodiment of the principle of the invention comprising substrate 20, photo absorbing layer 30, barrier layer 40, a first and second contact area 110, a metal layer 6 and a metal layer 65. Substrate 20 is provided as a base for deposition and has deposited on one face metal layer 60 for connection to electronic circuitry. In an exemplary embodiment metal layer 60 is constituted of gold. Photo absorbing layer 30 is deposited on the second face of substrate 20 opposing the first face. Photo absorbing layer 30 comprises a doped semiconductor responsive to photons of the object wavelength, and preferably is deposited to a thickness on the order of an optical absorption length. In one embodiment photo absorbing layer 30 is deposited to between one and two times the optical absorption length. In an exemplary embodiment photo absorbing layer 30 comprises one of n-doped InAs; n-doped InAsSb; n-doped InGaAs; n-doped type II super lattice of the type InAs/InGaSb; and n-doped HgCdTe. In an alternative embodiment absorbing layer 30 comprises one of p-doped InAs; p-doped InAsSb; p-doped InGaAs; p-doped type II super lattice of the type InAs/InGaSb; and p-doped HgCdTe.

Barrier layer 40 is deposited directly on photo absorbing layer 30 without requiring passivation. Barrier layer 40 is deposited to a thickness sufficient to substantially prevent tunneling of majority carriers from photo absorbing layer 30 to first and second contact area 110, and in an exemplary embodiment is deposited to a thickness of 50-100 nm. Barrier layer 40 comprises a material selected to exhibit a high band gap barrier for majority carriers from photo absorbing layer 30 and substantially no band gap barrier for minority carriers. Barrier layer 40 is thus sufficient to block both the flow of thermalized majority carriers and the tunneling of majority carriers from photo absorbing layer 30 to first and second contact area 110. Thus, for an n-type photo absorbing layer 30, the band gap difference appears in the conduction band, whereas substantially no band gap offset appears in the valence band. In one embodiment barrier layer 40 comprises one of AlSb, AlAsSb, GaAlAsSb, AlPSb, AlGaPSb and HgZnTe. In an exemplary embodiment photo absorbing layer 30 comprises n-doped InAs and barrier layer 40 is comprised of $AlAs_xSb_{1-x}$, with x~0.15, and thus there is ~0 valence band offset.

Contact layer 50 as described above in relation to FIG. 1A is deposited on barrier layer 40. Contact layer 50, which as will be described further is etched to define first and second contact area 110, functions to absorb the minority carriers diffused from the absorbing layer 30 and is essentially a contact layer. In an exemplary embodiment contact layer 50 is deposited to a thickness of 20-50 nm and is constituted of one of InAs; InAsSb; InGaAs; type II super lattice of the type InAs/InGaSb; HgCdTe and GaSb. Contact layer 50 may be n-doped or p-doped without exceeding the scope of the invention. Advantageously, contact layer 50 may be constituted of the same material as photo absorbing layer 30. Contact layer 50 is etched, preferably by photolithography, to define first and second contact area 110. Advantageously etching of barrier layer 40 or absorbing layer 30 is not required. In an exemplary embodiment a selective etchant is used which does not etch barrier layer 40. Metal layer 65 is deposited on each of first and second contact area 110, and in an exemplary embodiment is constituted of gold. Thus, a single photo absorbing layer and barrier layer is utilized, with each unetched portion of contact layer 50 defining a pixel or individual detector.

The above has been described in an embodiment in which two pixels, or detectors are defined, however this is not meant to be limiting in any way. A large array of photo-detectors produced as above is specifically included in the invention.

Figure 1C:
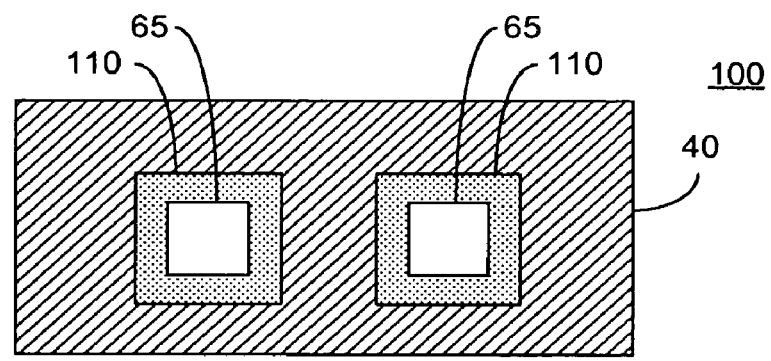
FIG. 1C illustrates a top level view of the multi-pixel photo-detector of FIG. 1B according to a principle of the invention.

FIG. 1C illustrates a top level view of multi-pixel photo-detector 100 of FIG. 1B according to a principle of the invention showing barrier layer 40, first and second contact area 110 and metal layer 65 defined on each of first and second contact area 110.

Figure 2A:
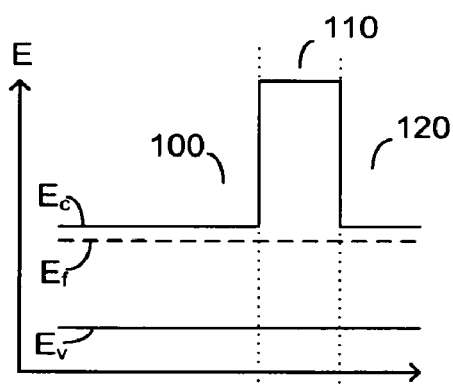
FIG. 2A illustrates the energy band levels of an embodiment of the structure of FIG. 1 according to the principle of the invention in which the photo absorbing layer is n-doped and the contact layer is n-doped.

FIG. 2A illustrates the energy band levels of an embodiment of the structure of FIG. 1 according to the principle of the invention in which the photo absorbing layer is n-doped and the contact layer is n-doped, in which the x-axis indicates position along the structure of FIG. 1 and the y-axis indicates energy levels in an arbitrary illustrative manner. Three energy band levels are depicted: $E_v$ the valence band energy band level; $E_f$, the Fermi energy band level; and $E_c$ the conducting band energy level. Area 100 represents the energy band levels within photo absorbing layer 30, area 110 represents the energy band levels within barrier layer 40 and area 120 represent the energy band levels within contact layer 50.

The valence band energy level is substantially constant throughout areas 100, 110 and 120, and thus minority carriers are not obstructed from flowing from photo absorbing area 100 to contact area 120. It is to be noted that due to the energy levels the minority carriers are captured in contact area 120. Barrier layer 40, represented by area 110, is thick enough so that there is negligible tunneling of majority carriers through it. In an exemplary embodiment barrier layer 40 is deposited to a thickness of 50-100 nm, and the band gap barrier of area 110 is high enough so that there is negligible thermal excitation of majority carriers over it. Area 120 shows energy band levels on a par with that of area 100 however this is not meant to be limiting in any way. In one embodiment $E_f$ in contact layer area 120 is slightly higher than their values in photo absorbing area 100 with the increase being attributed to an increased doping concentration. It is to be noted that no depletion layer is present and therefore there is no SRH current. Photocurrent is a result of optically generated minority carriers which diffuse from photo absorbing area 100 to contact area 120.

Figure 2B:
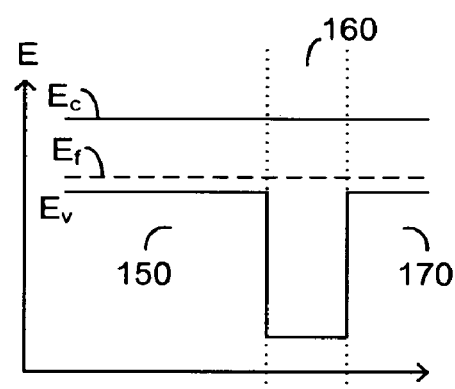
FIG. 2B illustrates the energy band levels of an embodiment of the structure of FIG. 1 according to the principle of the invention in which the photo absorbing layer is p-doped and the contact layer is p-doped.

FIG. 2B illustrates the energy band levels of an embodiment of the structure of FIG. 1 according to the principle of the invention in which the photo absorbing layer is p-doped and the contact layer is p-doped; in which the x-axis indicates position along the structure of FIG. 1 and the y-axis indicates energy levels in an arbitrary illustrative manner. Three energy band levels are depicted: $E_v$, the valence band energy level; $E_f$, the Fermi energy band level; and $E_c$ the conducting band energy level. Area 150 represents the energy band levels within photo absorbing layer 30, area 160 represents the energy band levels within barrier layer 40 and area 170 represent the energy band levels within contact layer 50.

The conduction band energy level is substantially constant throughout areas 150, 160 and 170, and thus minority carriers are not obstructed from flowing from photo absorbing area 150 to contact area 170. It is to be noted that due to the energy levels the minority carriers are captured in contact area 170. Barrier layer 40, represented by area 160, is thick enough so that there is negligible tunneling of majority carriers through it. In an exemplary embodiment barrier layer 40 is deposited to a thickness of 50-100 nm, and the band gap barrier of area 160 is high enough so that there is negligible thermal excitation of majority carriers over it. Area 170 shows energy band levels on a par with that of area 150 however this is not meant to be limiting in any way. In one embodiment $E_f$ in contact layer area 170 is slightly higher than their values in photo absorbing area 150 with the increase being attributed to an increased doping concentration. It is to be noted that no depletion layer is present and therefore there is no SRH current. Photocurrent is a result of optically generated minority carriers which diffuse from photo absorbing area 150 to contact area 170.

Figure 3A:
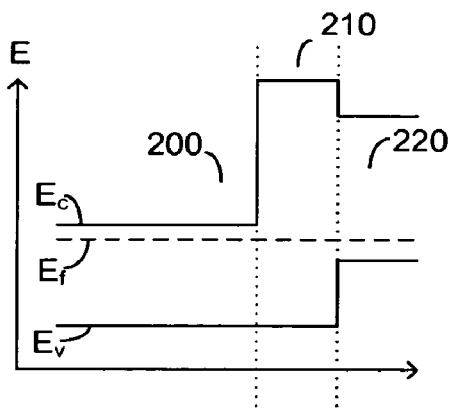
FIG. 3A illustrates the energy band levels of an embodiment of the structure of FIG. 1 according to the principle of the invention in which the photo absorbing layer is n-doped and the contact layer is p-doped.

FIG. 3A illustrates the energy band levels of an embodiment of the structure of FIG. 1 according to the principle of the invention in which the photo absorbing layer is n-doped and the contact layer is p-doped; in which the x-axis indicates position along the structure of FIG. 1 and the y-axis indicates energy levels in an arbitrary illustrative manner. Three energy band levels are depicted: $E_v$, the valence band energy level; $E_f$, the Fermi energy band level; and $E_c$ the conducting band energy level. Area 200 represents the energy band levels within photo absorbing layer 30, area 210 represents the energy band levels within barrier layer 40 and area 220 represent the energy band levels within contact layer 50.

The valence band energy level is substantially constant throughout areas 200 and 210 and is higher in area 220, and thus minority carriers are not obstructed from flowing from photo absorbing area 200 to contact area 220. It is to be noted that due to the energy levels the minority carriers are captured in contact area 220. Barrier layer 40, represented by area 210, is thick enough so that there is negligible tunneling of majority carriers through it. In an exemplary embodiment barrier layer 40 is deposited to a thickness of 50-100 nm, and the band gap barrier of area 210 is high enough so that there is negligible thermal excitation of majority carriers over it. It is to be noted that no depletion layer is present and therefore there is no SRH current. Photocurrent is a result of optically generated minority carriers which diffuse from photo absorbing area 200 to contact area 220.

Figure 3B:
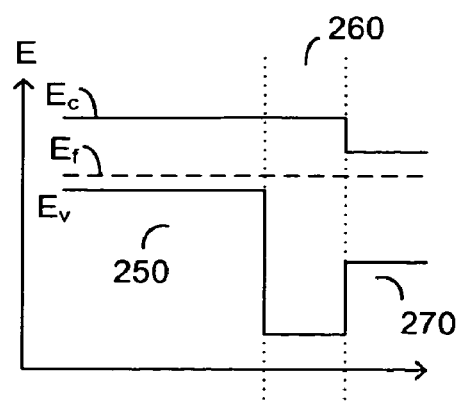
FIG. 3B illustrates the energy band levels of an embodiment of the structure of FIG. 1 according to the principle of the invention in which the photo absorbing layer is p-doped and the contact layer is n-doped.

FIG. 3B illustrates the energy band levels of an embodiment of the structure of FIG. 1 according to the principle of the invention in which the photo absorbing layer is p-doped and the contact layer is n-doped; in which the x-axis indicates position along the structure of FIG. 1 and the y-axis indicates energy levels in an arbitrary illustrative manner. Three energy band levels are depicted: $E_v$ the valence band energy level; $E_f$, the Fermi energy band level; and $E_c$ the conducting band energy level. Area 250 represents the energy band levels within photo absorbing layer 30, area 260 represents the energy band levels within barrier layer 40 and area 270 represent the energy band levels within contact layer 50.

The conduction band energy level is substantially constant throughout areas 250 and 260 and it is lower in area 270, and thus minority carriers are not obstructed from flowing from the photo absorbing area 250 to contact area 270. It is to be noted that due to the energy levels the minority carriers are captured in contact area 270. Barrier layer 40, represented by area 260, is thick enough so that there is negligible tunneling of majority carriers through it. In an exemplary embodiment barrier layer 40 is deposited to a thickness of 50-100 nm, and the band gap barrier of area 260 is high enough so that there is negligible thermal excitation of majority carriers over it. It is to be noted that no depletion layer is present and therefore there is no SRH current. Photocurrent is a result of optically generated minority carriers which diffuse from photo absorbing area 250 to contact area 270.

FIG. 4 illustrates a high level flow chart of the process of manufacture of the photo-detector of FIG. 1. In stage 1000 a substrate material is provided as a support for deposition. In stage 1010, a photo absorbing layer is deposited on the substrate. Preferably the photo absorbing layer is deposited to a thickness on the order of the optical absorption length and in an exemplary embodiment is deposited to a thickness of between one and two times the optical absorption length.

In stage 1020, a barrier material is selected such that the flow of thermalized majority carriers from the photo absorbing layer deposited in stage 1010 would be negligible, and the flow of minority carriers is not impeded. In stage 1030, the barrier material selected in stage 1020 is deposited to a thickness sufficient to prevent tunneling of majority carriers through the barrier material. In an exemplary embodiment the thickness is between 50 and 100 nm. Preferably the barrier material is deposited directly on the photo absorbing layer deposited in stage 1010.

In stage 1040, a contact layer is deposited, preferably directly on the barrier material deposited in stage 1030. In stage 1050, the desired contact areas are defined. Preferably, the contact areas are defined by photolithography and a selective etchant which stops on the top of the barrier layer. Alternatively, the etchant may be controlled to stop once the uncovered portions of contact layer 50 are removed. Thus, the depth of the etch is equivalent to the thickness of the contact layer 50. Advantageously, in an exemplary embodiment no other layer is etched.

In stage 1060 a metal layer is deposited on the contact areas defined in stage 1050 so as to enable electrical connection. Preferably the metal layer is deposited directly on the contact areas defined in stage 1050. In stage 1070, a metal layer is deposited on substrate 20 provided in stage 1000 so as to enable electrical connection.

Deposition of the photo absorbing layer of stage 1010, the barrier layer of stage 1030 and the contact layer of stage 1040 may be accomplished by any means known to those skilled in the art including, without limitation molecular beam epitaxy, metal organic chemical vapor deposition, metal organic phase epitaxy or liquid phase epitaxy.

Thus the present embodiment enable a photo-detector sensitive to a target waveband comprising a photo absorbing layer, preferably exhibiting a thickness on the order of the optical absorption length. In an exemplary embodiment the photo absorbing layer is deposited to a thickness of between one and two times the optical absorption length. A contact layer is further provided, and a barrier layer is interposed between the photo absorbing layer and the contact layer. The barrier layer exhibits a thickness sufficient to prevent tunneling of majority carriers from the photo absorbing layer to the contact layer, and a band gap barrier sufficient to block the flow of thermalized majority carriers from the photo absorbing layer to the contact layer. The barrier layer does not block minority carriers.

An infra-red detector in accordance with the principle of the invention can be produced using either an n-doped photo absorbing layer or a p-doped photo absorbing layer, in which the barrier layer is designed to have no offset for minority carriers and a band gap barrier for majority carriers. Current in the detector is thus almost exclusively by minority carriers. In particular, for an n-doped photo absorbing layer the junction between the barrier layer and the absorbing layer is such that there is substantially zero valence band offset, i.e. the band gap difference appears almost exclusively in the conduction band offset. For a p-doped photo absorbing layer the junction between the barrier layer and the absorbing layer is such that there is substantially zero conduction band offset, i.e. the band gap difference appears almost exclusively in the valence band offset.

Advantageously the photo-detector of the subject invention does not exhibit a depletion layer, and thus the dark current is significantly reduced. Furthermore, in an exemplary embodiment passivation is not required as the barrier layer further functions to achieve passivation.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

I claim:

1. A method of producing a photo-detector, the method comprising:
    providing a substrate;
    depositing on said substrate a photo absorbing layer comprising a doped semiconductor that exhibits a valence band energy and a conducting band energy during operation of the photo-detector;
    depositing on said deposited photo absorbing layer a barrier layer comprising an undoped semiconductor
    depositing on said deposited barrier layer a contact layer comprising a doped semiconductor, and
    configuring said barrier layer to allow minority carrier current flow while blocking majority carrier current flow between the photo-absorbing and contact layers.

2. A method according to claim 1, further comprising selectively etching said deposited contact layer to define a plurality of contact areas.

3. A method according to claim 1, wherein at least one of depositing said photo absorbing layer, depositing said barrier layer and depositing said contact layer is done via one of molecular beam epitaxy, metal organic chemical vapor deposition, metal organic phase epitaxy and liquid phase epitaxy.

4. The method of claim 1, where depositing said barrier layer includes depositing a contiguous layer that extends past said contact layer.

5. The method of claim 2, where etching includes etching the contact layer such that the barrier layer extends beyond said contact areas.

6. A method of producing a photo-detector, the method comprising:
    providing a substrate;
    depositing, on said substrate, a photo absorbing layer comprising an n-doped semiconductor exhibiting a valence band energy and a conducting band energy;
    depositing, on said photo-absorbing layer, a barrier layer having a specified thickness;
    depositing, on said barrier layer, a contact layer comprising a doped semiconductor;
    configuring said barrier layer such that it exhibits a valence band energy substantially equal to said valence band energy of said photo absorbing layer and a conduction band energy greater than the conduction band energy of said photo absorbing layer and such that said barrier layer forms a conduction energy band offset between the photo absorbing layer and the contact layer;
    configuring the barrier layer thickness and conduction energy band offsets such that they are sufficient to prevent tunneling of majority carriers between said photo absorbing layer and said contact area and to substantially block the flow of thermalized majority carriers between said photo absorbing layer and said contact area; and
    where depositing the contact layer includes depositing the contact layer such that it comprises individual sections which are separate from each other in a direction across the photo-detector, each section corresponding to an individual detector element; and
    where depositing the barrier layer includes depositing said barrier layer such that it extends past the individual sections of the contact layer in the direction across the photo-detector, and is monolithically provided for each of the individual detector elements, thereby blocking the flow of majority carriers to exposed surfaces of said barrier layer and passivating the photo-detector during operation.

7. A method according to claim 6, where depositing the contact layer such that it comprises individual sections includes selectively etching the contact layer to define said individual sections.

8. A method according to claim 6, wherein at least one of said depositing steps includes molecular beam epitaxy, metal organic chemical vapor deposition, metal organic phase epitaxy or liquid phase epitaxy.

9. The method of claim 7, where said selectively etching includes etching to but not through said barrier layer.

10. A method of creating a photo-detector, the method comprising:
providing a substrate;
depositing, onto said substrate, a photo absorbing layer comprising a p-doped semiconductor exhibiting a conduction band energy and valence band energy;
depositing, onto said photo-absorbing layer, a barrier layer exhibiting a thickness;
depositing, onto said barrier layer, a contact layer comprising a doped semiconductor;
configuring said barrier layer such that
said barrier layer exhibits a conduction band energy substantially equal to said conduction band energy of said photo absorbing layer and a valence band energy less than the valence band energy of said photo absorbing layer such that said barrier layer forms a valence energy band offset between the photo absorbing layer and the contact layer,
said barrier layer's thickness and said valence energy band gap are sufficient to prevent tunneling of majority carriers between said photo absorbing layer and said contact layer and to substantially block the flow of thermalized majority carriers between said photo absorbing layer and said contact layer, and
said barrier layer blocks the flow of majority carriers to exposed surfaces of said barrier layer, thereby passivating the photo-detector during operation; and
where depositing said contact layer includes dividing the contact layer into individual sections which are separate from each other in a direction across the photo-detector, each section corresponding to an individual detector element, and
where depositing the barrier include depositing said barrier layer such that said barrier layer extends past the individual sections of the contact layer in the direction across the photo-detector, and is monolithically provided for each of the individual detector elements.

11. A method according to claim 10, where depositing the contact layer such that it comprises individual sections includes selectively etching the contact layer to define said individual sections.

12. A method according to claim 10, wherein at least one of said depositing steps includes molecular beam epitaxy, metal organic chemical vapor deposition, metal organic phase epitaxy or liquid phase epitaxy.

13. The method of claim 11, where said selectively etching includes etching to but not through said barrier layer.

14. A method for creating a photo-detector, the method comprising:
providing a substrate;
depositing, onto said substrate, a first layer comprising a doped semiconductor exhibiting a valence band energy and a conduction band energy;
depositing, onto said first layer, a barrier layer comprising a semiconductor exhibiting a valence band energy and a conduction band energy;
depositing, onto said second layer, a second layer comprising a doped semiconductor exhibiting a valence band energy and a conduction band energy and having the same majority carrier type as the first layer;
configuring the respective valence band energy and conduction band energy of the first layer, the barrier layer, and the second layer to allow the flow of photo-generated minority carriers and substantially block the flow of majority carriers between the first layer and the second layer during photodetector operation;
where depositing said second layer includes separating said second layer into individual sections which are isolated from each other in a direction across the photo-detector, each section corresponding to an individual detector element; and
and where depositing a barrier layer includes depositing said barrier layer such that extends past the individual sections of the second layer in the direction across the photo-detector, and is monolithically provided for each of the individual detector elements, thereby passivating the photodetector by blocking the flow of majority carriers to exposed surfaces of said barrier layer.

15. A method according to claim 14, wherein at least one of said depositing steps includes molecular beam epitaxy, metal organic chemical vapor deposition, metal organic phase epitaxy or liquid phase epitaxy.

16. A method for creating photo-detector with a reduced dark current, the method comprising:
providing a substrate;
depositing, onto said substrate, a first layer comprising an electrically conductive semiconductor having majority and minority carrier types with associated energy bands;
depositing, onto said first layer, a barrier layer with a barrier energy gap and associated conduction and valence bands;
depositing, onto said barrier layer, a second layer comprising an electrically conductive semiconductor having majority and minority carrier types and an associated second layer energy gap;
configuring the first and second layer energy bands and the barrier layer conduction and valance band edges to enable minority carrier current flow while blocking majority carrier current flow between the first and second layers by; and
configuring the barrier layer to restrict lateral electrical conduction within said barrier layer.

17. The method of claim 16, where said configuring the barrier layer to restrict lateral electrical conduction includes using an un-doped semiconductor for said barrier layer.

18. The method according to claim 16, where depositing the second layer includes separating the second layer into individual sections.

19. The method according to claim 18, where separating includes selectively etching the second layer.

20. A method according to claim 16, wherein at least one of said depositing steps includes molecular beam epitaxy, metal organic chemical vapor deposition, metal organic phase epitaxy or liquid phase epitaxy.

21. The method of claim 19, where said selectively etching includes etching down to but not through said barrier layer.

22. The method of claim 19, where etching includes etching the second layer such that the barrier layer extends beyond said individual sections.

23. The method of claim 16, where depositing said barrier layer includes creating a monolithic barrier layer that extends beyond the second layer.

24. The method of claim 16, where depositing the contact layer includes forming a mesa on the barrier layer such that the barrier layer laterally extends beyond the contact layer.

25. The method of claim 16, where depositing a first layer and depositing a second layer both include depositing a semiconductor having the same majority carrier type.

26. A method of making a photo-detector with a reduced dark current, comprising:
providing a substrate
depositing, onto said substrate, a first layer comprising an electrically conductive semiconductor having majority and minority carrier types with associated energy bands;
depositing, onto said first layer, a barrier layer comprising a semiconductor with a barrier energy gap and associated conduction and valence bands;
depositing, onto said barrier layer, a second layer comprising an electrically conductive semiconductor having majority and minority carrier types and an associated second layer energy gap; and
configuring the relationship between the first and second layer energy bands and the barrier layer conduction and valence band edges to enable minority carrier current flow while blocking majority carrier current flow between the first and second layers;
where depositing the second layer includes depositing said second layer such that it forms a mesa on the barrier layer such that the said barrier layer laterally extends beyond the mesa, thereby passivating the photo-detector by preventing majority carriers from reaching exposed portions of the barrier layer.

27. The method according to claim 26, where depositing the second layer includes separating the second layer into individual sections.

28. The method according to claim 27, where separating includes selectively etching the second layer.

29. A method according to claim 26, wherein at least one of said depositing steps includes molecular beam epitaxy, metal organic chemical vapor deposition, metal organic phase epitaxy or liquid phase epitaxy.

30. The method of claim 28, where said selectively etching includes etching down to but not through said barrier layer.

31. The method of claim 26, where depositing a first layer and depositing a second layer both include depositing a semiconductor having the same majority carrier type.

* * * * *